US005866858A

United States Patent [19]

Dewey

[11] Patent Number: 5,866,858

[45] Date of Patent: Feb. 2, 1999

[54] LOUDSPEAKER METHOD AND APPARATUS

[76] Inventor: Jon Severen Dewey, 875 Lodge St., Reno, Nev. 89503

[21] Appl. No.: 621,626

[22] Filed: Mar. 26, 1996

[51] Int. Cl.$^{6}$ .......... H05K 5/00

[52] U.S. Cl. .......... 181/151; 181/199

[58] Field of Search .......... 181/144, 145, 181/146, 148, 151, 199, 207

[56] References Cited

U.S. PATENT DOCUMENTS

| | | | |
|---|---|---|---|
| 3,578,103 | 5/1971 | Lennes | 181/151 |
| 4,802,551 | 2/1989 | Jacobsen | 181/199 |
| 4,924,964 | 5/1990 | Olsen | 181/151 |
| 4,985,106 | 1/1991 | Nelson | 156/276 |
| 5,194,701 | 3/1993 | Yamada-Scriba | 181/151 |

*Primary Examiner*—Khanh Dang

[57] ABSTRACT

A container apparatus including a loudspeaker enclosure means along with a separate compartment means for alternative purposes and means to provide immediate, temporary sound attenuation of enclosure walls around a loudspeaker for ease of transporting whereby a form fitting cushion filled with sound attenuation materials is installed around the enclosure to dampen vibrations due to the firing of the loudspeaker.

1 Claim, 7 Drawing Sheets

LOUDSPEAKER METHOD AND APPARATUS

BACKGROUND OF THE INVENTION

1. Field of Invention

This invention relates to the general field of audio loudspeaker enclosures. The invention is more particularly related to free standing, loudspeaker enclosures for use in interior and exterior locations. It is even more particularly related to loudspeaker enclosures made of relatively light weight, thin walled construction. The invention is even more particularly related to a container apparatus with separate compartments for loudspeaker enclosures and a compartment to enclose along with a means to store temporary, heavy density, loose-granular, sound attenuation materials. Further the invention is even more particularly related to means to increase the portability of a loudspeaker enclosure and increase its acoustic performance. In addition, the invention is even more particularly related to an apparatus which combines a loudspeaker enclosure with a container for various uses.

2. Description of the Prior Art

There is much prior art in the general field of loudspeaker enclosures. There has been prior art which cites the existence of freestanding loudspeaker enclosures for interior and exterior locations. There has even been prior art which cites various means of attenuating the resonant sound vibrations of the material surfaces which enclose loudspeakers. There has even been prior art which cites the existence of loudspeaker enclosures with multiple compartments. There has even been prior art which cites the combination of a loudspeaker enclosure with a container for plant materials. Referring further to this prior art entitled "Hanging Planter Pot Speaker Enclosure" U.S. patent application Ser. No. 754,596 now U.S. Pat. No. 4,063,387, while this art might suggest the use of a loose sound attenuation material used in conjunction with a speaker enclosure there is no soil material described nor a method cited which specifies the makeup or relative weight /density of soil material. Continuing further, this prior art is not physically shaped to use soil to attenuate the vibration of the of the loudspeaker enclosure brought about by the rear firing of the speaker driver. None of this prior art is particularly directed to the inventive combination. Until the present invention there has been no loudspeaker enclosure apparatus cited as being of relatively light weight materials with a secondary chamber wherein sound attenuation material can be filled into a cushion which can then be placed against the exterior of the loudspeaker enclosure to dampen the resonant vibration of the enclosure walls and can also be removed and emptied to allow for ease of transporting. And further, there has not been a double-walled loudspeaker enclosure wherein sound attenuation material can be filled around the outside of the loudspeaker compartment or removed for transport. In addition there has been no prior art which combines a free standing and multi-use-container together with a loudspeaker enclosure. In this respect the prior art is inapplicable to and does not contemplate the within invention.

SUMMARY OF THE INVENTION

There are numerous loudspeaker enclosures for use in interior and exterior locations. Commonly, loudspeaker enclosures for use in exterior locations have been made of relatively light weight, thin-walled construction which may be less than adequate to dampen the resonant vibrations of the enclosure during the operation of the loudspeaker driver. These secondary vibrations can distort the intended sound quality. This is especially true for low-mid-range frequency and low frequency loudspeaker drivers which can launch pressure waves of such strength so as to move light weight, low density materials. Drivers operating within these frequencies necessitate dampening the enclosure with heavy density attenuation materials. In the past, possibly due to concerns of excessive weight impacting the cost of product shipping, massed produced loudspeaker enclosures have tended to lack the appropriate amount of dense mass in the enclosures construction or dense sound attenuation materials used to dampen the enclosure.

Turning now to another issue, the expected life-cycle of electronic devices is often a matter of only a few years and much material resource is invested in their housings. As a practical concern, the form of the enclosure housing the speaker could be more utilitarian and allow for possible alternative functions should the electronic device fail or become obsolete.

I have now conceived a free standing apparatus with separate compartments for loudspeaker enclosures and a multipurpose compartment which can hold a sound attenuation cushion or other items and be used for alternative purposes. In addition, I have devised a means to provide temporary sound attenuation of a loudspeaker enclosure whereby a form-fitting cushion can be filled with silica sand, lead, rubber or other heavy-dense, granular material and then installed around the exterior of a loudspeaker enclosure immediately before the speaker is operated. This method could be used independent of the apparatus invention to cover other loudspeaker enclosures. Also, I have devised a means to provide temporary sound attenuation of a loudspeaker enclosure whereby a double-walled enclosure can be filled or emptied with sound attenuation materials such as silica sand, rubber, lead or other granular or heavy fluid material.

Accordingly, it is an object of the present invention to provide an enclosure with an optimum environment for loudspeaker drivers to perform;

Another object of this invention is to provide a method for creating sound attenuation which allows for installation after the loudspeaker enclosure has been transported and so allow ease of portability of the speaker enclosure;

Another object of this invention is to provide a combined loudspeaker enclosure and multipurpose container which is designed to be used for various purposes;

Still another object of this invention is to provide a combined speaker enclosure and multipurpose container that can be used in both interior and exterior locations;

It is still another object of this invention to combine a loudspeaker enclosure and multipurpose container that would provide separate, multiple-loudspeaker enclosures for multiple channel, sound-source reproduction;

It is still another object of this invention to provide a combined loudspeaker enclosure and multi-use-container that can be fabricated by alternate manufacturing processes and materials to establish a variety of shapes and appearances.

The forgoing and other objects and advantages will become apparent to those skilled in the art upon reading the description of the preferred embodiment which follows in conjunction with a review of the appended drawings.

CROSS REFERENCE TO RELATED PATENT APPLICATIONS

There are no patent applications filed by me related to the within application.

DESCRIPTION OF THE PREFERRED EMBODIMENT

FIGS. 1, 2, 3, 4, 5, 6, 7, 8, and 9 should be viewed and studied together in order to understand this invention completely. However, some individual reference will be made to certain of the figures.

Figure 1:
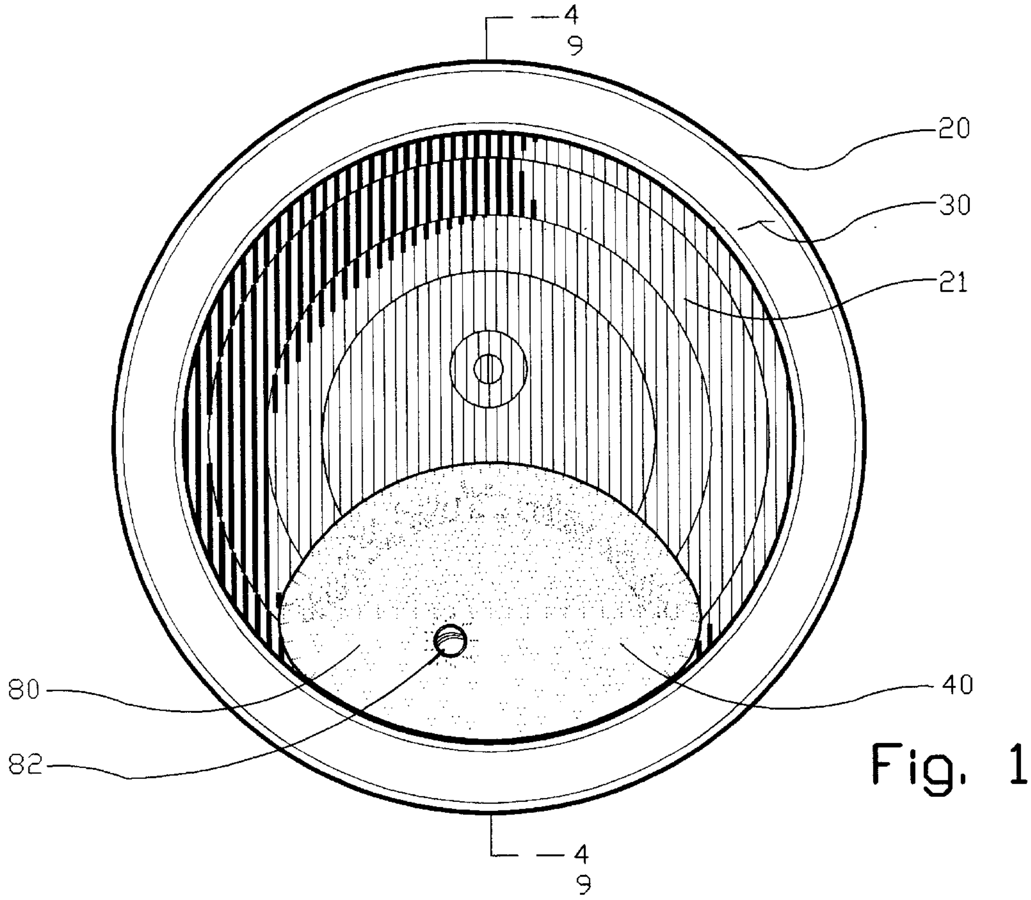
FIG. 1 is a top view of an apparatus suitable to practice the method of this invention.
Figure 2:
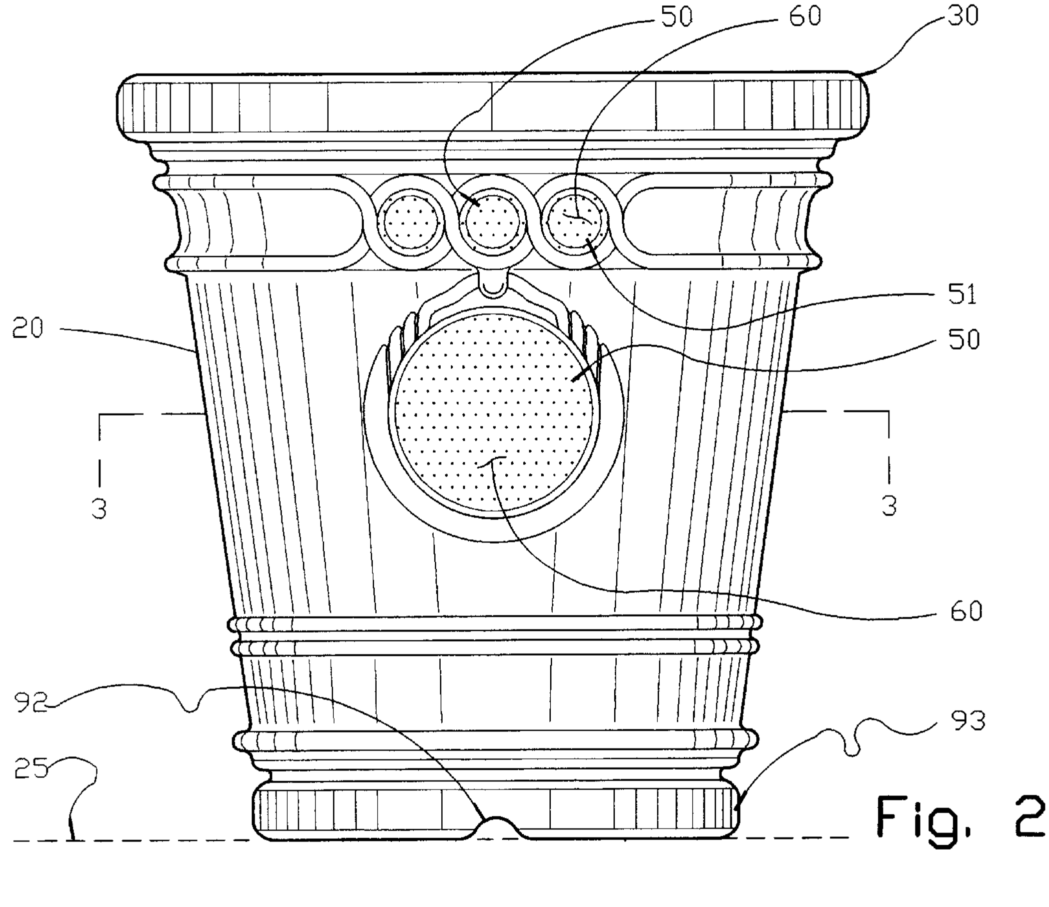
FIG. 2 is a front elevational view of the apparatus of FIG. 1.

Referring to FIG. 1, the container 20 comprises an open compartment 21 for multipurpose uses and an enclosed compartment 40 for loudspeaker assemblies. At the top of the container apparatus 20 is a continuous, perimeter rim 30. This rim 30 can provide support for a variety of options which are mentioned as follows to suggest uses that are possible: the rim 30 could support a lid-cover making the multipurpose compartment 21 a place for storage; or, it could support a lid with a bowl-like depression, water spout & drain and connections to within the multipurpose compartment 21 to a recirculating pump to make a decorative fountain or the like. As shown in FIG. 2 the container apparatus 20 is an upright, freestanding body resting on surface 25. The loudspeaker compartment has penetrations through the exterior wall consisting of acoustic ports 50 and ventilation ports 51. A protective grille 60 protects both types of port openings. A notch 92 at the base 93 of the container 20 provides access to the underside of the container apparatus 20 for wires or drainage of water.

Figure 3:
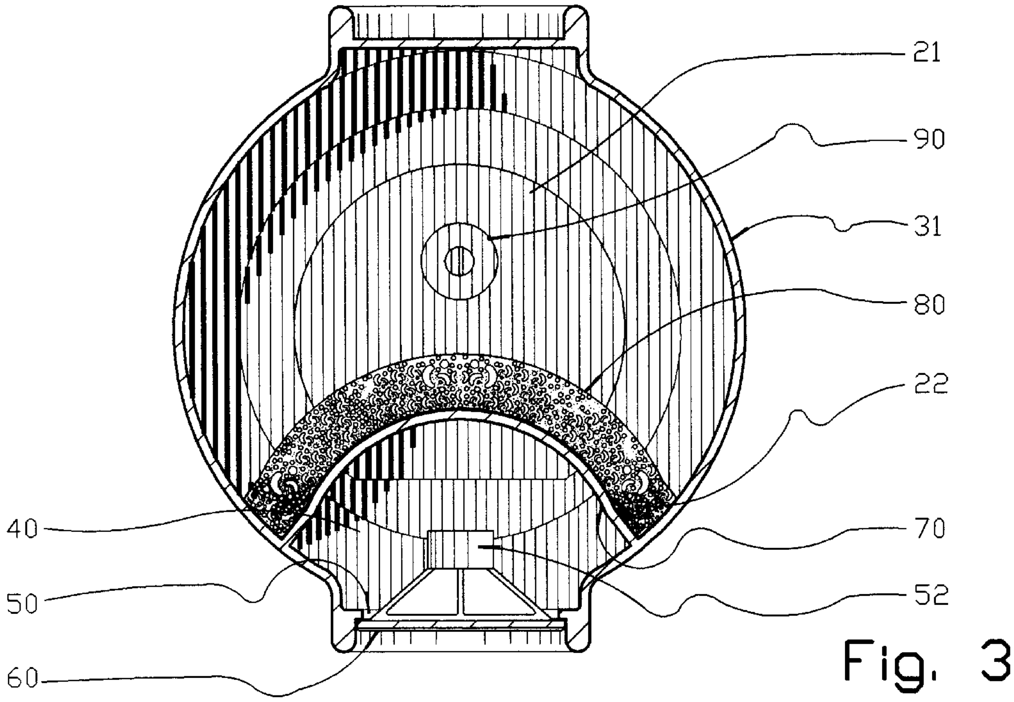
FIG. 3 is a cross-sectional view on 3—3 of FIG. 2.

Now referring to FIG. 3 The loudspeaker driver assembly 52 is connected to the audio port opening 50 which is protected from weather and abrasion by a grille 60. The surface 70 covers the rear and side portions of the loudspeaker driver assembly 52 and separates the loudspeaker compartment 40 from the multipurpose compartment 21. This surface 70 connects directly to surface 31 which is the exterior enclosing vertical wall for both the multipurpose compartment 21 and the loudspeaker compartment 40. The rear and side surfaces 70 of loudspeaker compartment 40 protrude into the multipurpose compartment 21 in such manner that there is open space 22 between the outer wall of the loudspeaker compartment 40 and the inner surface of the multipurpose compartment 21. A sound attenuation cushion 80 covers the rear of the loudspeaker compartment 40 and at the bottom of the multipurpose compartment 21 is a drain 90. The later items will be discussed further with reference to FIG. 4.

Figure 4:
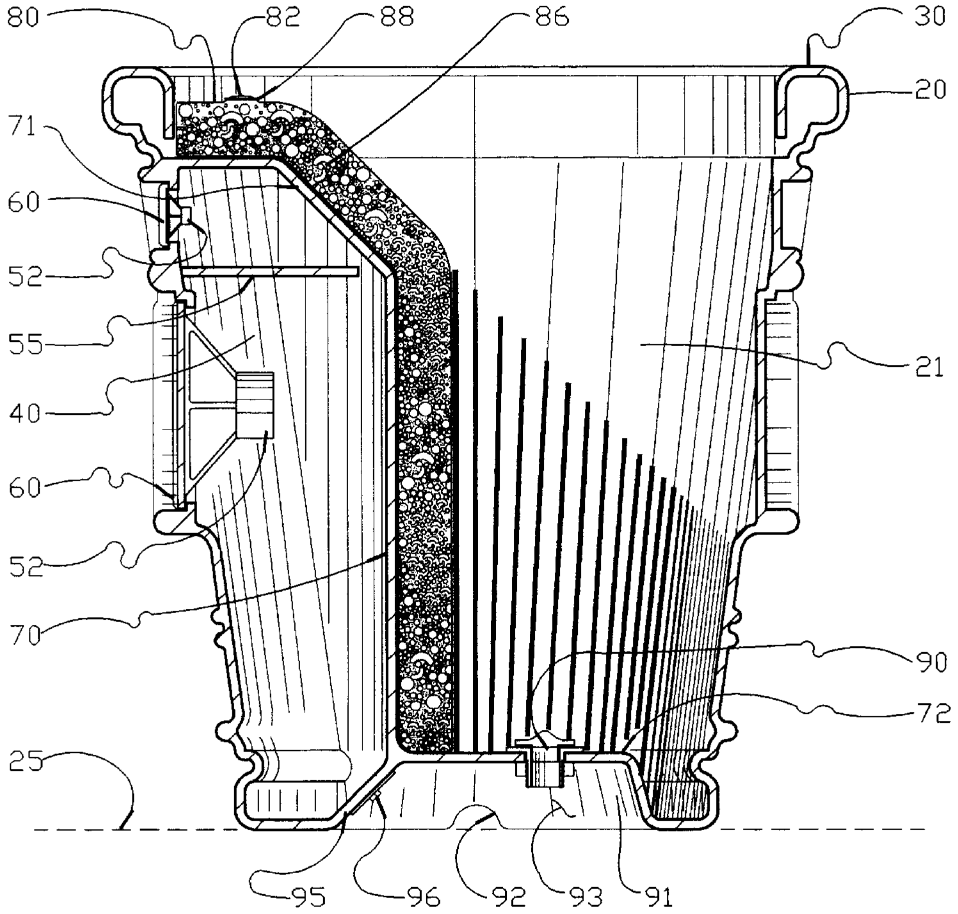
FIG. 4 is a cross-sectional view on 4—4 of FIG. 1.

Now, referring to FIG. 4, recessed below the rim 30 is a relatively horizontal surface 71 which encloses the top portion of the adjoining loudspeaker compartment 40. The perimeter edge of this surface 71 turns downward and extends as a vertical wall 70 to meet the bottom plane 72 of the multipurpose compartment 21. A surface 55 extends horizontally from the exterior wall and partially separates the audio waves emanating from each loudspeaker driver 52 to prevent overlapping and creating a distorted sound. This surface is to be known hereafter as a wave isolation wall. In addition, to lessen the potential resonate vibration of the loudspeaker enclosure during the firing of the loudspeaker 52, the top surface 71 and surrounding surfaces 70 of the loudspeaker compartment 40 are covered by a sound attenuation cushion 80.

The attenuation cushion 80 consists of parallel surfaces forming a continuous envelope of pliable material offset a narrow distance from one another by a band of connecting perimeter surfaces which form the fop and bottom closures. The hollow interior of the cushion is filled, through an opening 82 at the top, with a loose material 86 such as a heavy density silica sand or other material having properties which wound inhibit the vibration of the enclosure walls. The opening 82 can be closed with a wire tie 88 or a myriad of alternate devises which could prevent the filled material from escaping. Water which may have entered the multipurpose compartment 21 can escape through the drain 90 at the bottom raised surface 72. This same surface 72 forms the top of a concavity 91 which is sheltered from direct exposure of outdoor weather elements and raised above potentially wet, or otherwise undesirable surfaces. If moisture of the like enters the multipurpose compartment 21 it can exit through the drain 90 and drain to the outside of the container apparatus 20 through notch openings 92 along the supporting base 93. In this same hollow area 91 is a surface 95 for the attachment of annular grommet openings 96 for electrical wires and jack outlets for audio wire connections. These wires pass to and from this cavity 91 thought the notches 92 at the base 93 of the exterior surface of the container apparatus 20.

Figure 5:
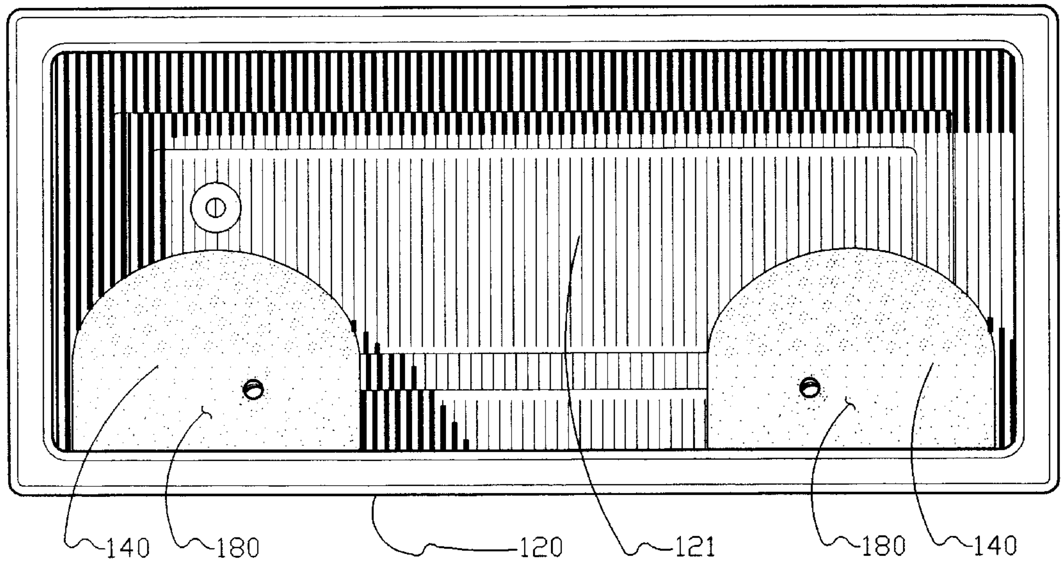
FIG. 5 is a top plan view of an apparatus suitable to practice the method of this invention.

While the previous figures have shown the practice of the invention through a cylindrical shape the apparatus can be unlimited shapes and form. For instance, FIG. 5 is an alternate embodiment of the loudspeaker container and method apparatus which shows the container 120 as an elongated shape with a large, single, open compartment 121 for multipurpose uses and enclosed, multiple loudspeaker compartments 140 located at separate ends of the container apparatus 120. The multiple configuration of separated loudspeaker compartments provides for multiple-channel sound-source capabilities. Sound attenuation cushions 180 cover the loudspeaker compartments 140.

Figure 6:
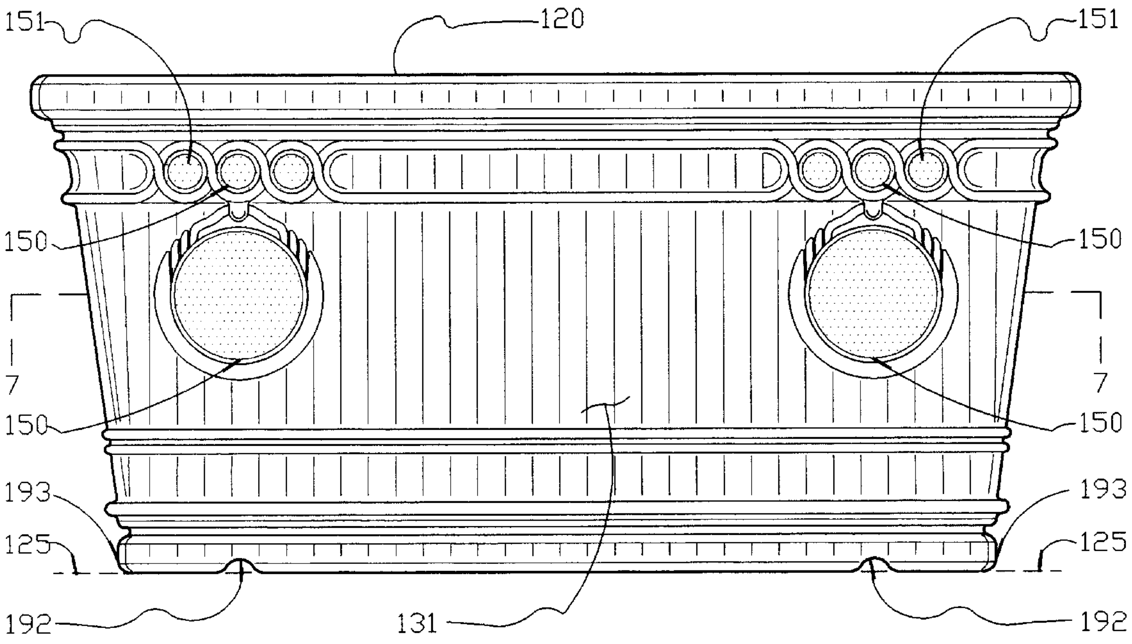
FIG. 6 is a front elevational view of FIG. 5.

FIG. 6 shows the container as an upright apparatus 120 in an elongated form with multiple clusters of audio port 150 and vent port 151 openings positioned at opposite ends of the same surface 131. Shown at the supporting base 193, upon surface 125, are notch openings 192.

Figure 7:
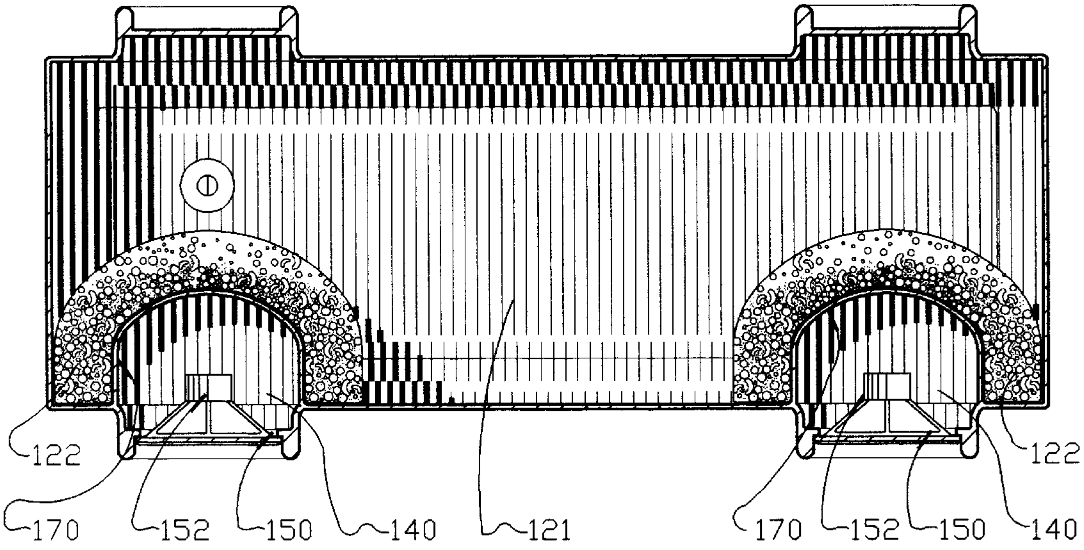
FIG. 7 is a cross-sectional view on 7—7 of FIG. 6.

FIG. 7 shows a space 122 between the partitioning surface 170 and the multipurpose compartment 121 this allows the entire area around the partitioning surface 170 to be covered with a sound attenuation 180. The loudspeaker compartments 140 have port openings 150 for the loudspeaker driver assemblies 152 and ventilation ports 151.

Figure 8:
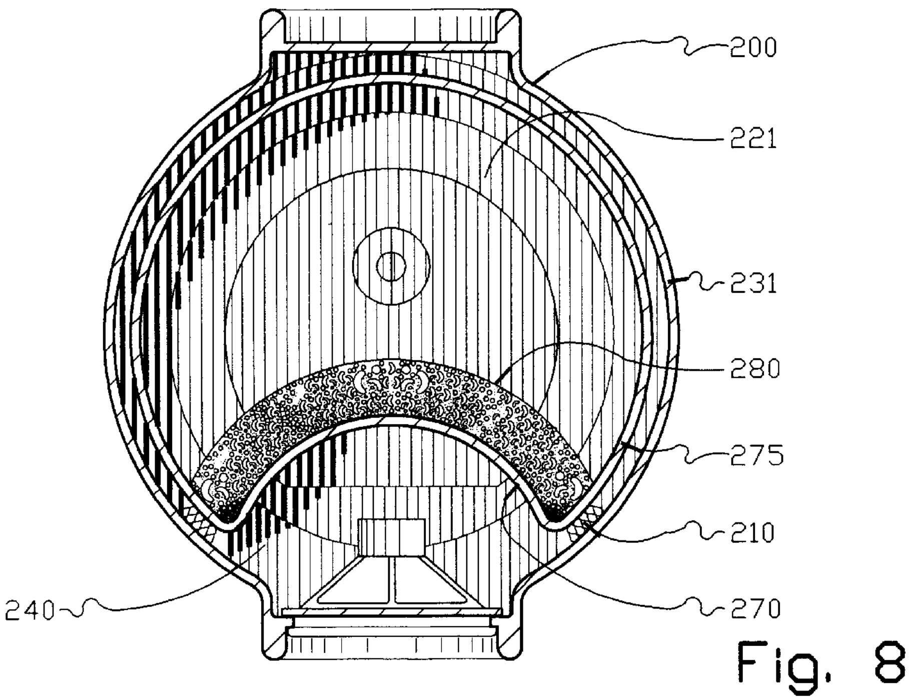
FIG. 8 is an alternate embodiment of the apparatus suitable to practice this invention showing a cross-sectional view on 8—8 of FIG. 9.

FIG. 8 is an alternate embodiment for the same invention as shown in FIG. 3 and is an example of a result of employing a variation of the large scope of fabrication technique which will allow the invention to assume a wide array of material finish appearances and includes a variation to the apparatus as shown in FIG. 3. Within the container apparatus 220 is the surface 270 which is the main separation of the multipurpose compartment 221 from the loudspeaker compartment 240 and connects to surface 275 which duplicates the function of the surface 231. The sound attenuation cushion 280 covers surface 270. As shown, the multipurpose compartment 221, and a large extent of its enclosing surfaces rests within the main exterior surface 231. A strip of dense, flexible and resilient material acts as a gasket 210 to seal the essentially vertical gap between the outer enclosure 231 and inner enclosure 275.

Figure 9:
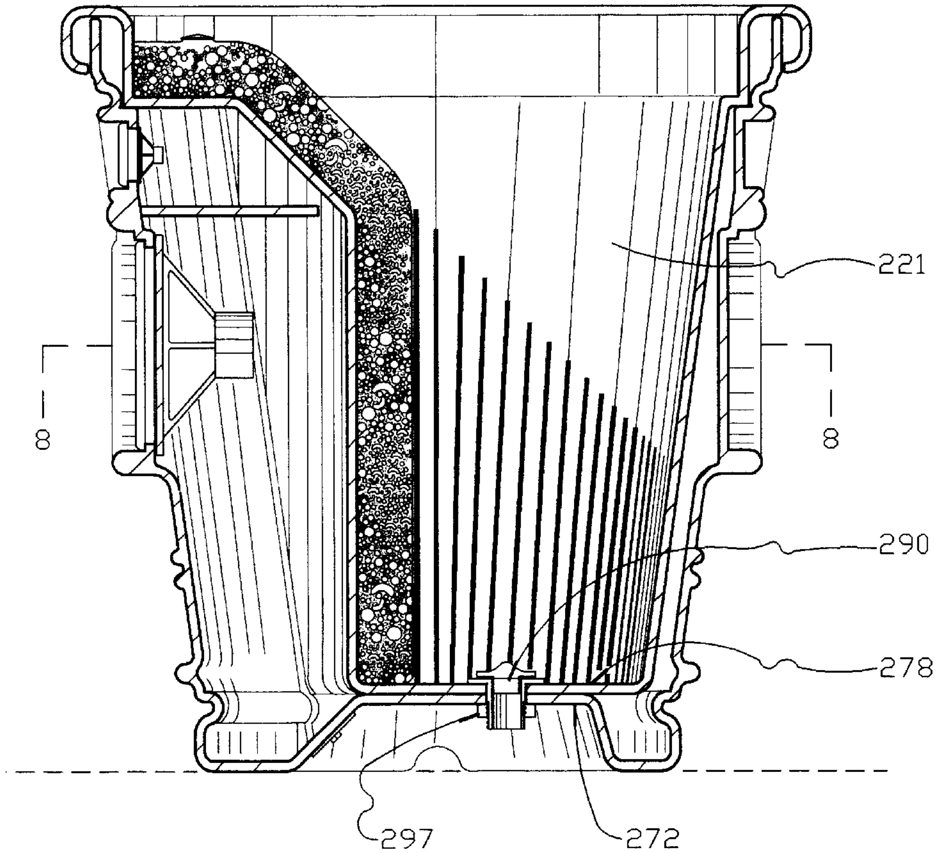
FIG. 9 is a cross-sectional view on 9—9 of FIG. 1.

As shown in FIG. 9 the horizontal surface 278 forms the bottom of the multipurpose compartment 221. Surface 278 duplicates the function of surface 272. The bottom surface 278 of the multipurpose compartment 221 and the outer container surface 272 are held together by the threaded, hollow-bolt drain 290 and threaded fastener 297.

Figure 10:
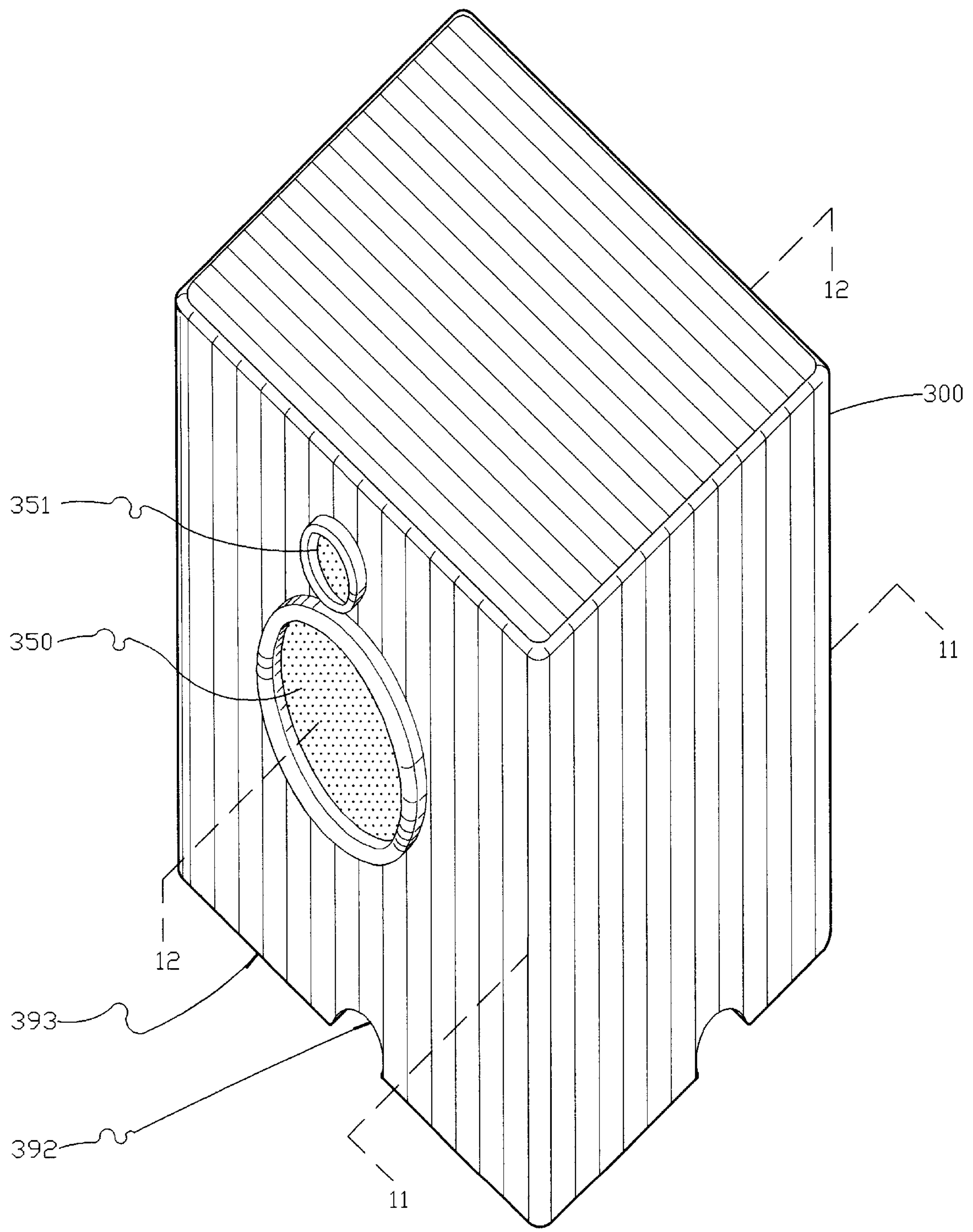
FIG. 10 is a perspective view of an apparatus suitable to practice the method of this invention.

FIG. 10 shows the container 300 as an upright form with continuous enclosing surfaces on all sides. An opening 351 penetrates the exterior of the container 300 and provides ventilation of the loudspeaker compartment. Additionally, there is an opening 350 into the container for the attachment of a loudspeaker driver at the interior of the loudspeaker compartment. A niche 392 passes through the base 393 to allow access of electrical wires to the underside of the container.

Figure 11:
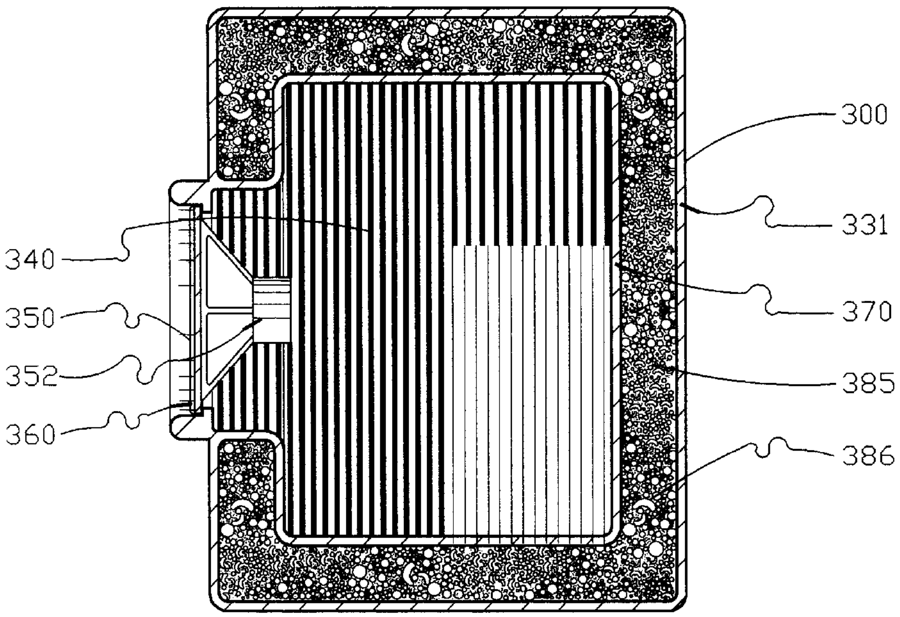
FIG. 11 is a cross-sectional view on 11—11 of FIG. 10.

FIG. 11 shows the container 300 with a continuous outer surface 331 which is closed on all sides. Within the outer surface 331 is an inner surface 370 which is offset a short distance to provide a continuous envelope 385 that is filled with particulate sound attenuation material 386. The surface 370 surrounds a hollow space which is the loudspeaker compartment 340. An opening 350 into the loudspeaker compartment 340 is provided for the attachment of the loudspeaker driver 352 which is protected on the exterior with a grille 360.

Figure 12:
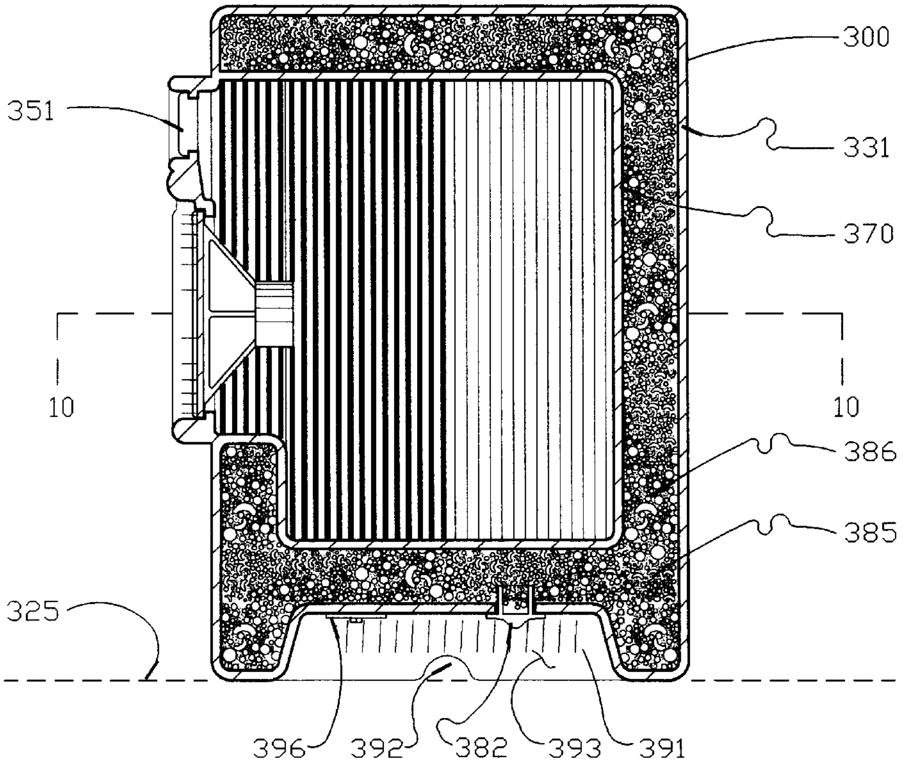
FIG. 12 is a cross-sectional view on 12—12 of FIG. 10.

FIG. 12 shows the container 300 as an upright form resting on surface 325 with a continuous outer surface 331 which encloses all sides. Within the outer surface 331 is an inner surface 370 which is offset a short distance to make a continuous envelope 385 that is filled with particulate sound attenuation material 386. A portion of the bottom side of the container is raised above potentially wet or otherwise undesirable surfaces to form a hollow recess 391. At this niche is an opening and plug device 382 through which sound attenuation material 386 can be filled. At the base 393 of the container are notches 392 for the passage of wires into this cavity 391 and connections to wire terminals 396. A port opening 351 into the loudspeaker compartment 340 provides ventilation.

Although these drawings have shown the container apparatus to be of a molded material the invention is not limited to any particular type or material of fabrication. It is to be understood that the materials used in each manufacturing case of the invention be appropriate to provide for resistance to weather elements if designed to be used outdoors and provide for the best acoustic properties.

While the embodiment of this invention, shown and described, are fully capable of achieving the objects and advantages desired, it must be understood that they are for purposes of illustration only, and not for purposes of limitations.

I claim:

1. Loudspeaker apparatus comprising: a first compartment formed of a continuous pliable sound attenuating envelope formed of pliable material having an exterior surface and an interior cavity, said interior cavity being filled with sound attenuating high density particulate material, and said compartment having an interior cavity and an exterior surface; a first opening through said pliable envelope interconnecting with said interior cavity; a loudspeaker located within said first opening; a second opening through said pliable envelope interconnecting with, and providing ventilation to said interior cavity; a third opening through said exterior surface of said envelope suitable to introduce particulate material into said interior cavity of said envelope; closure means for said third opening; and electrical connection means through said envelope for connecting to said loudspeaker.

* * * * *